(12) United States Patent
Forbes

(10) Patent No.: US 7,924,040 B2
(45) Date of Patent: *Apr. 12, 2011

(54) ELECTRICAL PROBE HAVING A CONDUCTIVE WHISKER

(76) Inventor: Leonard Forbes, Corvallis, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/762,533

(22) Filed: Apr. 19, 2010

(65) Prior Publication Data

US 2010/0201388 A1 Aug. 12, 2010

Related U.S. Application Data

(63) Continuation of application No. 11/966,601, filed on Dec. 28, 2007, now Pat. No. 7,728,607.

(51) Int. Cl.
*G01R 31/00* (2006.01)
*G01R 1/067* (2006.01)
*G01R 31/20* (2006.01)

(52) U.S. Cl. .............................. 324/755.02; 324/754.07

(58) Field of Classification Search .......................... None
See application file for complete search history.

(56) References Cited

U.S. PATENT DOCUMENTS

| | | | |
|---|---|---|---|
| 4,740,746 A * | 4/1988 | Pollock et al. ................ 324/761 |
| 5,045,781 A | 9/1991 | Gleason et al. | |
| 5,172,051 A * | 12/1992 | Zamborelli .................. 324/72.5 |
| 5,274,336 A | 12/1993 | Crook et al. | |
| 5,373,231 A * | 12/1994 | Boll et al. .................. 324/158.1 |
| 5,506,515 A | 4/1996 | Godshalk et al. | |
| 5,512,838 A | 4/1996 | Roach | |
| 5,565,788 A | 10/1996 | Burr et al. | |
| 5,982,187 A * | 11/1999 | Tarzwell ................. 324/755.05 |
| 6,252,391 B1 | 6/2001 | McAllister et al. | |

OTHER PUBLICATIONS

Sevick, Jerry. "A Simplified Analysis of the Broadband Transmission Line Transformer." High Frequency Electronics, pp. 48-53, Feb. 2004.
"Setting Up." https://www.cs.tcd.ie/courses/baict/bac/jf/labs/scope/setting.html. 6 pgs.
Tektronix. "Choosing a probe for your tektronix scope." http://www.reprise.com/host/tektronix/reference/choosing_a_probe.asp. Jan. 24, 2004. 3 pgs.

* cited by examiner

*Primary Examiner* — Roberto Velez
(74) *Attorney, Agent, or Firm* — Brooks, Cameron & Huebsch, PLLC

(57) ABSTRACT

Methods, devices, and systems for probing electrical circuits without loading the circuits are described herein. One embodiment of an electrical probe includes a coaxial cable having an inner conductor and an outer conductor, an extension portion of the inner conductor extending beyond the outer conductor at a probe end of the cable. The electrical probe includes a conductive whisker having a first portion separated from and extending a distance along the extension portion such that the first portion and the extension portion form a first capacitor and a second portion having a probe tip for receiving an input test signal from a circuit node under test.

20 Claims, 7 Drawing Sheets

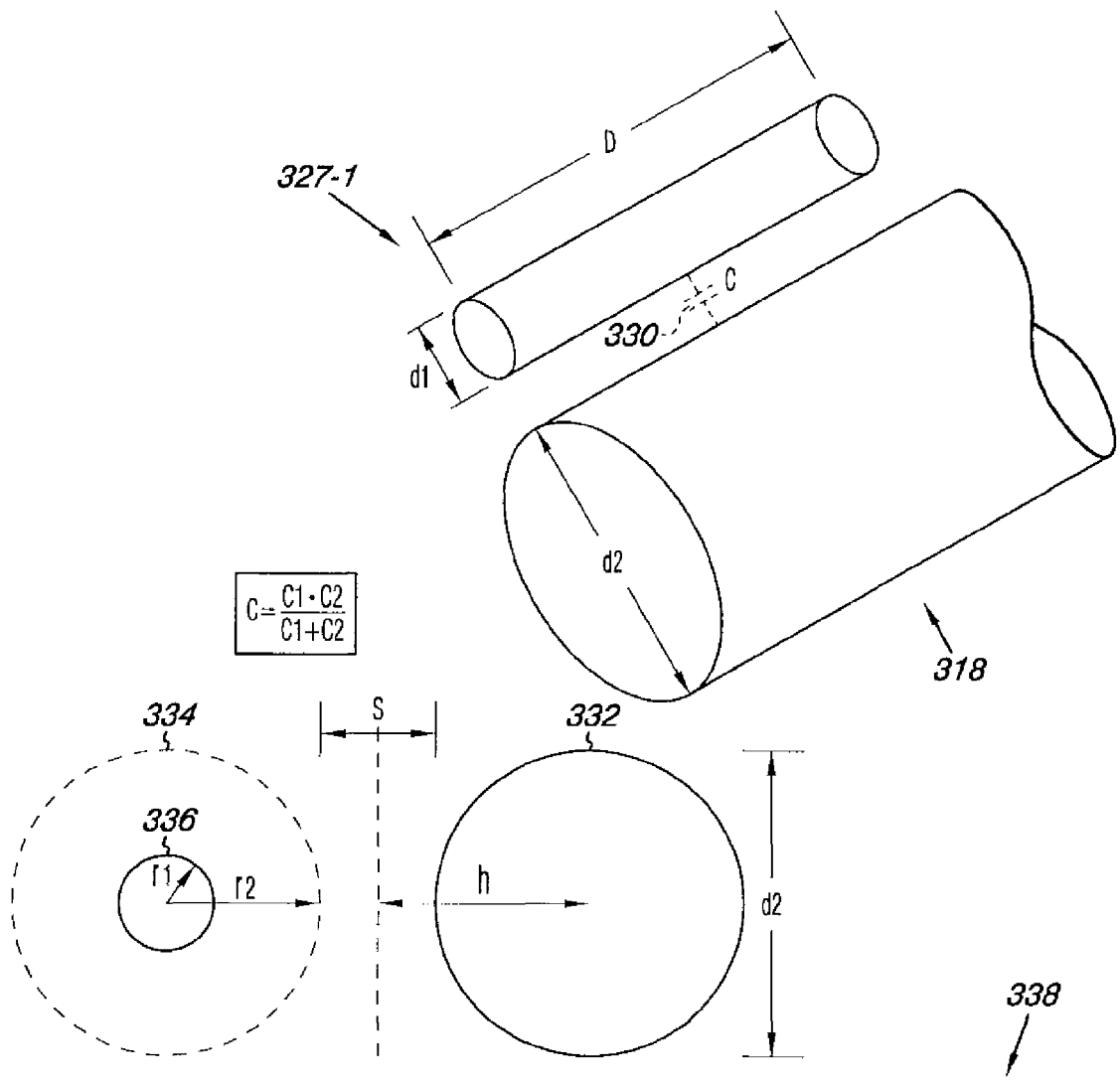

$$C1 = \frac{2\pi \varepsilon_r \varepsilon_o D}{\ln\left(\frac{r2}{r1}\right)} = \frac{2\pi \varepsilon_r \varepsilon_o D}{\ln\left(\frac{d2}{d1}\right)} \approx 18.5\,fF$$

$$C2 = \frac{\pi \varepsilon_r \varepsilon_o D}{\ln\left(\frac{4h}{d2}\right)} \approx 37.5\,fF$$

$$C = \frac{C1 \cdot C2}{C1 + C2} \approx 12.4\,fF$$

| PARAMETER | VALUE |
|---|---|
| d1 | 25 μm |
| d2 | 500 μm |
| $r2 = \frac{d2}{2}$ | 250 μm |
| $r1 = \frac{d1}{2}$ | 12.5 μm |
| S | 25 μm |
| $h = r2 + \frac{S}{2}$ | 262.5 μm |
| D | 250 μm |
| $\varepsilon_o$ | 8.85 $\frac{pF}{m}$ |
| $\varepsilon_r$ | 4 |

*Fig. 3C*

ELECTRICAL PROBE HAVING A CONDUCTIVE WHISKER

CROSS-REFERENCE TO RELATED APPLICATIONS

This application is a continuation of U.S. application Ser. No. 11/966,601, filed Dec. 28, 2007, the specification of which is incorporated herein by reference.

BACKGROUND

Electrical test probes are used to transmit a signal voltage from a circuit under test to an electronic test instrument, such as an oscilloscope, logic analyzer, voltmeter, or ammeter, among other test instruments. One desirable characteristic for a test probe is that the signal response at the test instrument, e.g., the probe output signal, is an accurate (although attenuated) representation of the probed test signal over a range of frequencies of interest. Another desirable characteristic is that the probe does not influence, e.g., "load," the response of the circuit under test.

Some test probes attempt to provide such characteristics by exhibiting both high resistance and low capacitance. A high probe resistance allows relatively little of the output current to flow through the probe, thereby decreasing any loading effect of the probe on the circuit under test. In various test probes, the frequency response of the probe is dependent upon the capacitance of the probe in parallel with the resistance of the circuit under test. Capacitive reactance varies as a function of frequency, causing the impedance of the probe to fall as the applied frequency increases. As such, the effective bandwidth of prior art probes has thus been limited by probe capacitance, thus making some such probes unsuitable for use in the GHz range.

Some test probes that can be used to measure test signals at relatively higher frequencies, e.g., the GHz range and above, use a relatively low input impedance, e.g., 50 ohms, which can be matched to a coaxial input line. However, circuits under test can be severely loaded by the lower impedance such that additional output drivers may need to be used to drive the lower impedance.

To increase the effective bandwidth of test probes, some prior approaches attempt to compensate for, e.g., reduce, probe tip capacitance by using active electronics in the probe tip, e.g., by using active probes which require a source of electrical power. However, such active probes have drawbacks that include relatively large and easily damaged probe tips as well as the use of additional components as well as a source of electrical power.

BRIEF DESCRIPTION OF THE DRAWINGS

FIG. 3C illustrates an example calculation for the capacitance of a capacitor associated with one or more probe embodiments of the present disclosure.

DETAILED DESCRIPTION

Methods, devices, and systems for probing electrical circuits without loading the circuits are described herein. One embodiment of an electrical probe includes a coaxial cable having an inner conductor and an outer conductor, an extension portion of the inner conductor extending beyond the outer conductor at a probe end of the cable. The electrical probe includes a conductive whisker having a first portion separated from and extending a distance along the extension portion such that the first portion and the extension portion form a first capacitor and a second portion having a probe tip for receiving an input test signal from a circuit node under test.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

Figure 1:
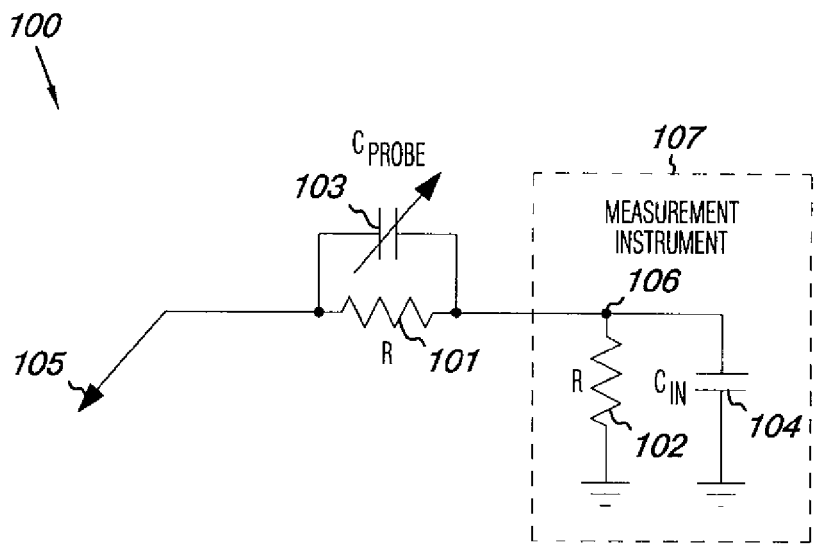
FIG. 1 illustrates a diagram of a prior art test probe coupled to a measurement instrument.

FIG. 1 illustrates a diagram of a prior art test probe 100 coupled to a measurement instrument 107. The test probe 100 is a passive probe. That is, the probe 100 does not require an electrical power source to function. The test probe 100 can be coupled to an input of the measurement instrument 107 via a coaxial cable (not shown in FIG. 1) using a BNC connector or other suitable connector.

The test probe 100 includes a probe tip 105 that is in series with a resistor 101, which provides a resistive divider with an input resistor 102 of the measurement instrument 107. As such, an input test voltage signal received to probe tip 105 is attenuated, e.g., the voltage at node 106 as measured by the measurement instrument 107 is reduced due to the voltage divider. As an example, the resistor 101 can be 9 megaohms and the resistor 102 can be 1 megaohm such that the probe 100 is a 10× probe. That is, an input test voltage signal received to probe tip 105 is attenuated ten times.

The resistor 101 is in parallel with an adjustable capacitor 103 and the input resistor 102 is in parallel with an input capacitance 104 of the measurement instrument 107. The values of the capacitors 103 and 104 are often on the order of picofarads. The relatively large resistance of resistor 101 can reduce the loading effects on a circuit node under test, but often limits the bandwidth of the probe 100 to low frequency ranges, e.g., below the GHz range.

Figure 2:
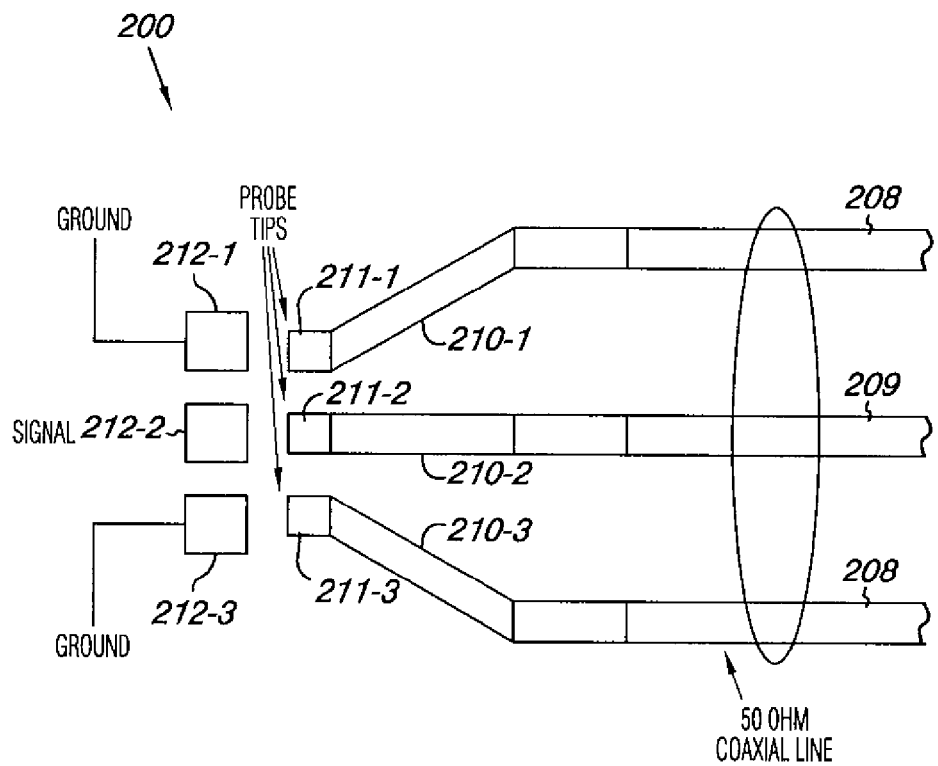
FIG. 2 illustrates a cross-sectional diagram of a portion of a prior art test probe.

FIG. 2 illustrates a cross-sectional diagram of a portion of a prior art test probe 200. The test probe 200 can be used to probe high frequency signals, e.g., signals in the GHz range. As shown in FIG. 2, the probe 200 includes a 50 ohm coaxial cable having an outer conductor 208 and an inner conductor 209. In this example, the outer conductor includes a pair of tapered conductive fingers 210-1 and 210-3 extending from the outer conductor 208 and a conductive finger 210-2 extending from the inner conductor 209. The conductive fingers 210-1, 210-2, and 210-3 include probe tips 211-1, 211-2, and 211-3, respectively. In operation, the probe tips 211-1, 211-2, and 211-3 are coupled to respective test pads 212-1, 212-2, and 212-3 of a circuit under test in a ground-signal-ground arrangement as shown.

The test probe 200 can be better suited for measuring high frequency signals than the test probe 100 shown in FIG. 1 due to the relatively lower impedance of the probe 200. However, the smaller impedance associated with the probe 200 can cause an increased loading of a circuit under test.

Various embodiments of the present disclosure provide an electrical test probe that can be used to measure signals on electrical circuit nodes without loading the circuit under test. One or more embodiments include an electrical test probe providing a relatively small capacitor coupled in series to the probe tip. In some embodiments the capacitance of the probe tip capacitor is not greater than about 15 fF (femtofarads). Embodiments are not limited to a particular value for the probe tip capacitor, e.g., the capacitance of the probe tip capacitor can be greater than or less than 15 fF. For example, in various embodiments, the capacitance is not greater than about 10 fF.

In one or more embodiments, the probe tip capacitor is connected in series to a relatively small resistor, e.g., a 50 ohm resistor, which can be used to sense an output signal that corresponds to the derivative of the input signal. That is, the output signal is the differentiated input signal, e.g., the derivative of the waveform at the circuit node being probed.

In one or more embodiments, the probe tip capacitor can be connected in series with a second capacitor to form a capacitive voltage division circuit. In various embodiments, the second capacitor is the capacitance of a coaxial line. In such embodiments, a fraction of the input test voltage signal, e.g., the output voltage signal, appears across the second capacitor.

Various embodiments of the present disclosure reduce or prevent loading of circuit nodes under test at high frequencies, e.g., in the GHz range and above, by using a relatively small capacitance capacitor coupled in series with the probe tip.

Figure 3A:
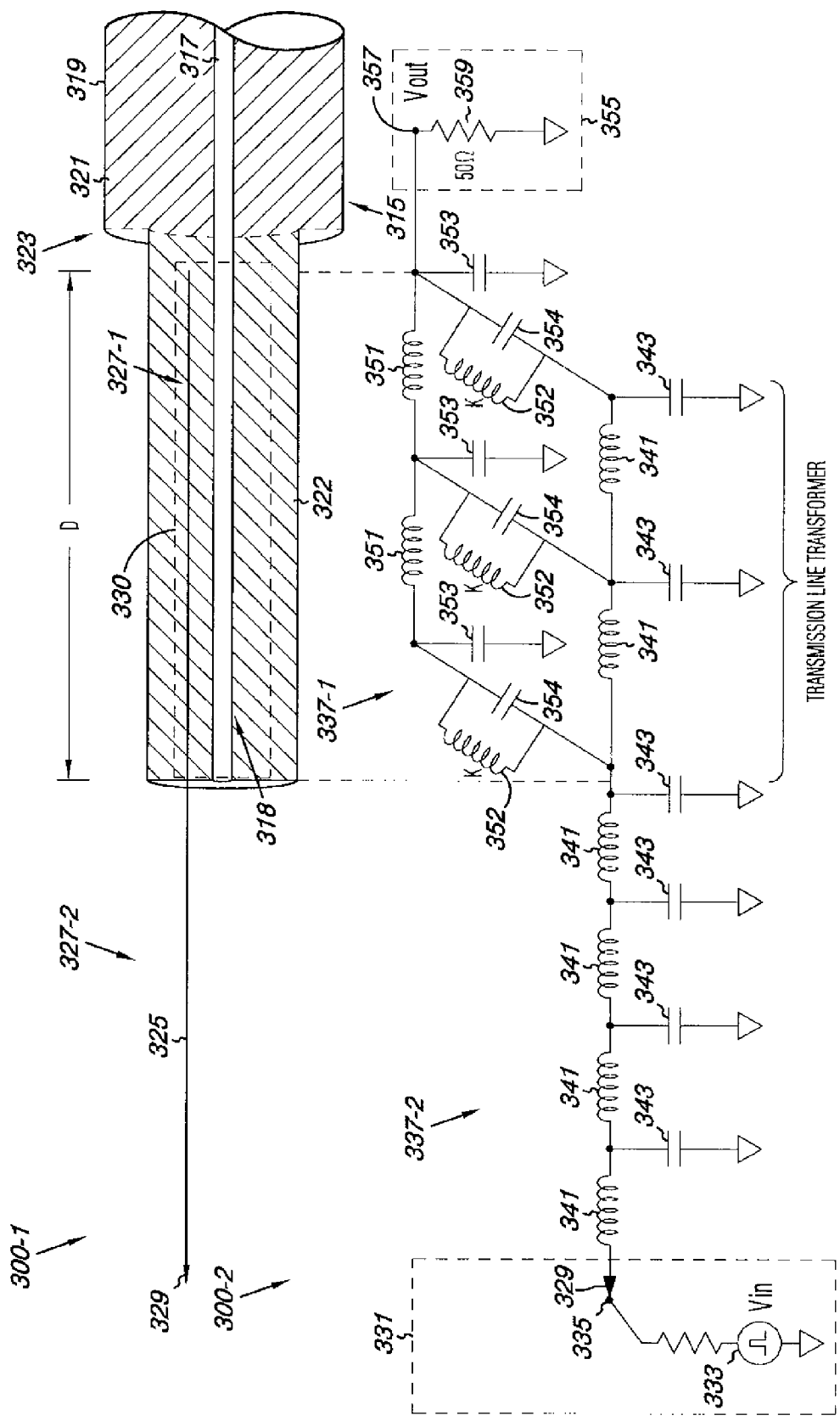
FIG. 3A illustrates a cross-sectional view of an electrical probe in accordance with an embodiment of the present disclosure along with a model circuit diagram for the probe.

FIG. 3A illustrates a cross-sectional view of an electrical probe 300-1 in accordance with an embodiment of the present disclosure along with a model circuit diagram 300-2 for the probe 300-1. The circuit model 300-2 is a high frequency model 300-2 that includes inductive effects that can become significant at frequencies in which the size of probing components become significant, e.g., frequencies in the GHz range.

In various embodiments of the present disclosure, an electrical test probe includes a small capacitor in contact with a circuit node under test. In such embodiments, the capacitor is sized so as to not load the circuit node such that the input test signal associated with the node is not degraded. In one or more embodiments, the small capacitor is connected in series with the input resistor of a terminated coaxial line.

In the embodiment illustrated in FIG. 3A, the probe 300-1 includes a coaxial cable 315 having an inner conductor 317 and an outer conductor 319. The inner conductor 317 and outer conductor 319 are include a dielectric material 321 therebetween. The coaxial line 315 can transmit received signals from the probe 300-1 to a test instrument, e.g., a measurement device such as an oscilloscope, spectrum analyzer, voltmeter, or ammeter, among other test instruments. In one or more embodiments, and as shown in FIG. 3A, a portion 318 of the inner conductor 317 extends beyond the outer conductor 321 at a probe end 323 of the cable 315.

In one or more embodiments, the probe, e.g., 300-1, includes a conductive whisker that includes a probe tip for contacting a test node of a circuit under test. For example, in various embodiments, and as shown in FIG. 3A, the probe 300-1 includes an elongate conductive whisker 325. In various embodiments and as illustrated in FIG. 3A, the conductive whisker 325 has a first portion 327-1 that extends a distance D along the extension portion 318 of the inner conductor 317, e.g., the whisker 325 overlaps the extension portion 318 by the distance D. As shown in FIG. 3A, the first portion 327-1 can be separated a distance from the extension portion 318.

In various embodiments, the first portion 327-1 of the whisker 325 can be attached to, and separated from, the extension portion 318 via a bonding material 322 such as an epoxy or other suitable material. The bonding material 322 can be a dielectric material 322. In one or more embodiments the dielectric material 322 can have a different dielectric constant than that associated with dielectric material 321.

The whisker 325 can be made of Tungsten, Tungsten Carbide, Beryllium Copper, Steel, and/or other suitable conductive materials. The whisker 325 can have a diameter of about 10-50 micrometers. In one or more embodiments, the whisker 325 has a diameter of about 25 micrometers. Embodiments are not limited to a particular whisker diameter. In various embodiments, and as illustrated in FIG. 3A, a diameter of the whisker 325 is less than a diameter of the inner conductor 317.

As an example, the distance D can be about 100-400 micrometers and the separation distance between the extension portion 318 of the inner conductor 317 and the overlapping first portion 327-1 of the whisker 325 can be about 200-300 micrometers. In one or more embodiments, the distance D is about 250 micrometers and the separation distance is about 260 micrometers. However, embodiments are not so limited, e.g., the overlapping distance D can be greater than 400 or less than 100 micrometers and the separation distance between the overlapping conductors 325 and 317 can be greater than 300 or less than 200 micrometers.

In various embodiments, the conductive whisker 325 includes a second portion 327-2, e.g., a portion of the whisker 325 that does not overlap the extension portion 318 of inner conductor 317. The second portion 327-2 includes a probe tip 329 for contacting a node of a circuit under test, e.g., to receive an input test signal from a circuit node under test.

Figure 3B:
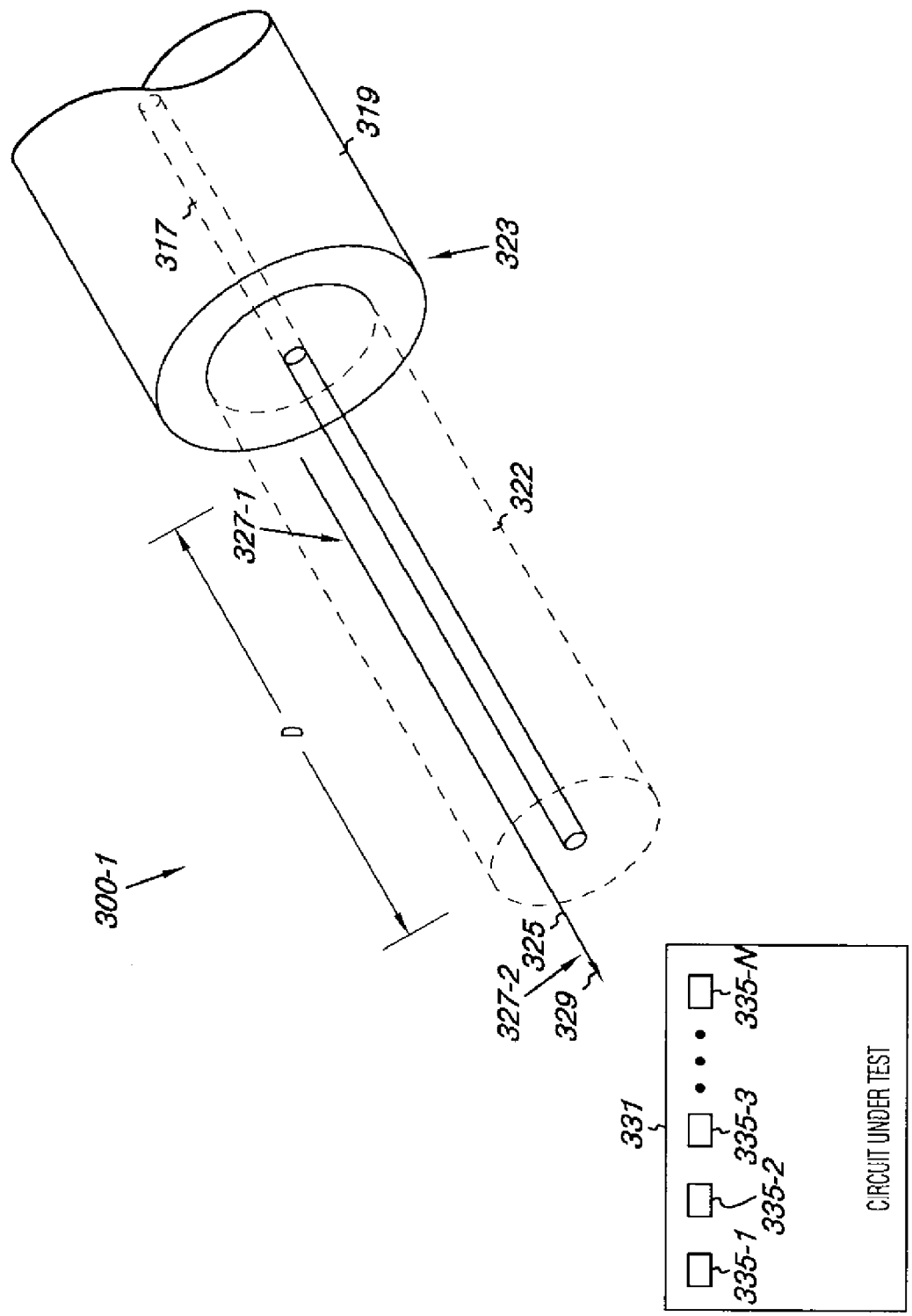
FIG. 3B illustrates a side view of the electrical probe shown in FIG. 3A.

In various embodiments and as described further in connection with FIGS. 3B and 3C, the overlap of the conductive whisker 325 and the inner conductor 317 produces a capacitive coupling effect. As such, the overlap of the conductive whisker 325 and the inner conductor 317 forms a capacitor 330. As such, the capacitor 330 is in series with the probe tip 329.

The capacitance of capacitor 330 depends on various factors such as the physical dimensions of the conductors 325 and 317, the overlap distance D, the separation distance of the overlapping portions 318 and 327-1, and the dielectric constant of the material 322, among other factors.

In various embodiments, the capacitance of capacitor 330 is not greater than about 15 fF. In one or more embodiments, the capacitance of capacitor 330 is between about 5 fF and 15 fF. However, embodiments are not limited to a particular capacitance of capacitor 330, e.g., embodiments can include a capacitor 330 having a capacitance greater than 15 fF or less than 5 fF.

The low capacitance 330 is connected in series to the circuit node under test, e.g., capacitor 330 is in series with the probe tip 329. As such, the probe 300-1 can reduce loading experienced by the node under test as compared to previous probes and probing techniques. Reduced loading of a circuit node can provide benefits such as a more accurate representation of the probed test signal over a range of frequencies.

In one or more embodiments, the coaxial line 315 of probe 300-1 can be coupled in series to an input resistor, e.g., input resistor 359, at an input end of the coaxial line 315, e.g., at an end of the cable 315 opposite probe end 323. In various embodiments and as illustrated in model 300-2 of FIG. 3A, the input resistor 359 can be the input impedance 359 of the cable 315 to a measurement instrument 355, e.g., an oscilloscope or other suitable measurement instrument. In various embodiments, the measurement instrument can determine one or more characteristics of the received input test signal based on an output signal, e.g., Vout at node 357, measured across the input resistor 359.

In the embodiment shown in FIG. 3A, the input impedance 359 is 50 ohms. The relatively low input impedance 359 in series with the low capacitance 330 allows the probe 300-1 to accurately probe high frequency input test signals without significantly loading the circuit node under test, e.g., node 335 of circuit 331 described further below.

A high frequency model 300-2 for the probe 300-1 is illustrated in FIG. 3A. The portion 337-1 of the model 300-2 represents a model of the overlapping portions of whisker 325 and inner conductor 317. The portion 337-2 represents a model of the second portion 327-2 of the whisker 325.

In the example shown in model 300-2, the probe 300-1 is in contact with a circuit under test 331. That is, the probe tip 329 of probe is in contact with a circuit node under test 335. As illustrated in FIG. 3A, the circuit under test 331 includes a voltage source 333 that can provide input test voltage signals to be probed at various test nodes, e.g., node 335.

At low frequencies, e.g., frequencies in the MHz range, the output voltage (Vout) of the probe 300-1, e.g., the voltage across the input resistor 359 at output node 357, is equal to the product of the input resistance 359, the capacitance 330, and the time derivative of the input test voltage signal at the node being tested, e.g., node 335 in this example. As noted above, at low frequencies, the inductive effects and sizes of the probe components do not have a significant effect.

However, at high frequencies, a circuit model which incorporates such factors is applicable. In model 300-2, the probe whisker 325 and the inner conductor 317 can be analyzed via transmission line analysis. In such analyses, each section of a transmission line much less than a quarter wavelength long can be represented by equivalent R (resistance), L (inductance), C (capacitance), and G (conductance) elements, as are known in the art. The transmission line equations can also be solved via a program such as SPICE (Simulation Program with Integrated Circuit Emphasis).

In the model 300-2 illustrated in FIG. 3A, the resistance of the transmission lines and parallel conductance between them are assumed small such that the transmission lines can be represented solely by inductive and capacitive elements. In the embodiment illustrated in FIG. 3A, the conductive whisker 325 is considered a lossless transmission line and is represented by a number of inductors 341 and capacitors 343 as shown in model 300-2. Similarly, the extension portion 318 of inner conductor 317 is considered a lossless transmission line and is represented by a number of inductors 351 and capacitors 353.

As shown in FIG. 3A, both inductive and capacitive coupling occurs between the overlapping first portion 327-1 of the whisker 325 and the extension portion 318 of the inner conductor 317. As such, the overlapping portions constitute a transmission line transformer as shown in model 300-2. In model 300-2, the capacitors 354 represent the mutual capacitive coupling between the whisker 325 and the inner conductor 317, while the inductors 352 represent the mutual inductive coupling between the transmission lines, e.g., the whisker 325 and the inner conductor 317, with K indicating the inductive coupling.

Figure 4:
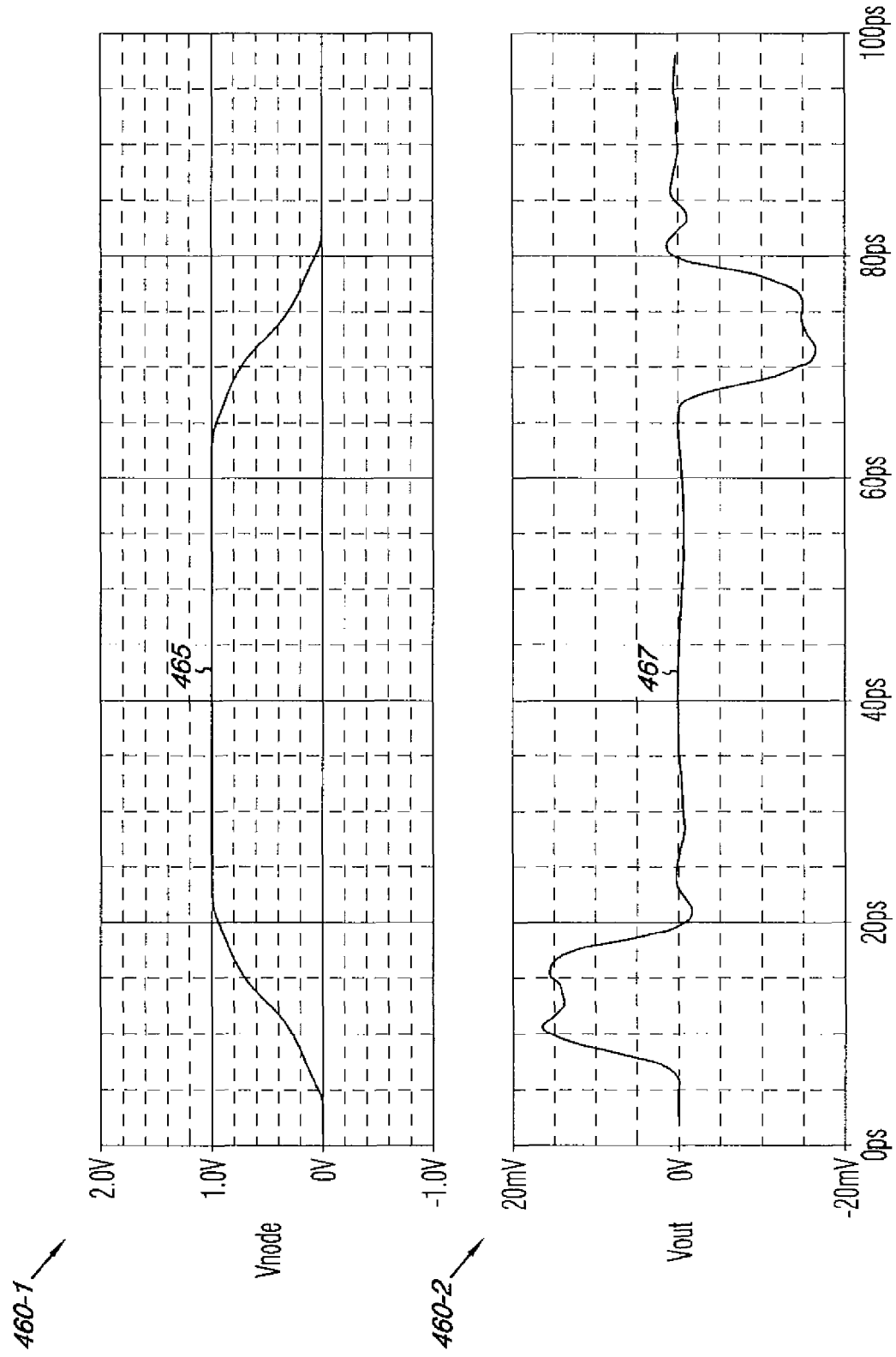
FIG. 4 illustrates an input waveform of a circuit under test and a corresponding output waveform of an electrical probe embodiment of the present disclosure.

In the embodiment illustrated in FIG. 3A, the probe 300-1 is a differentiating probe 300-1. That is, the output voltage waveform that appears across the terminating input resistor 359, e.g., at node 357, corresponds approximately to the derivative of the input test signal waveform, e.g., the time derivative of the input voltage signal at test node 335, with the inclusion of inductive effects associated with the high frequency signals. An example of a SPICE simulation of a probe such as the differentiating probe 300-1 as represented by a model such as model 300-2 is illustrated in FIG. 4.

FIG. 3B illustrates a side view of the electrical probe 300-1 shown in FIG. 3A. As shown in FIG. 3B, the probe 300-1 includes an elongate conductive whisker 325 having a first portion 327-1 that extends a distance D along an extension portion, e.g., 318 shown in FIG. 3A, of the inner conductor of a coaxial line. The whisker 325 includes a second portion 327-2 that extends beyond the extension portion 318 and terminates in a probe tip 329 that can couple to a circuit under test 331 having a number of input circuit test nodes 335-1, 335-2, 335-3, . . . , 335-N. The designator "N" is used to indicate that the circuit under test can include a number of test nodes, e.g., nodes that can be probed via tip 329 of probe 300-1.

In the embodiment illustrated in FIG. 3B, the overlapping portions of whisker 325 and inner conductor 317 are encapsulated by a dielectric epoxy material 322, which attaches the whisker 325 to the probe 300-1 and provides a separation distance between the whisker 325 and the inner conductor 317. As described in connection with FIG. 3A, the overlapping portions of the whisker 325 and inner conductor 317 form a capacitive element, e.g., 330 shown in FIG. 3A, that is coupled in series with the probe tip 329.

In various embodiments, an input end of the coaxial cable, e.g., an end opposite end 323 can be terminated at a measurement device, e.g., device 355 shown in FIG. 3A, by a resistor, e.g., by a 50 ohm input impedance such as resistor 359 shown in FIG. 3A. In some such embodiments, the low capacitance capacitor 330 is connected in series to the resistor. In one or more embodiments, the terminating resistor, e.g., 359 has a resistance of not more than about 50 ohms. In various embodiments, the low capacitance of the capacitor 330 in series with the probe tip 329 can prevent the relatively low resistance of resistor 359 from causing undesirable loading a circuit node under test, e.g., node 335-1, 335-2, 335-3, . . . , 335-N during high frequency probing.

Figure 6A:
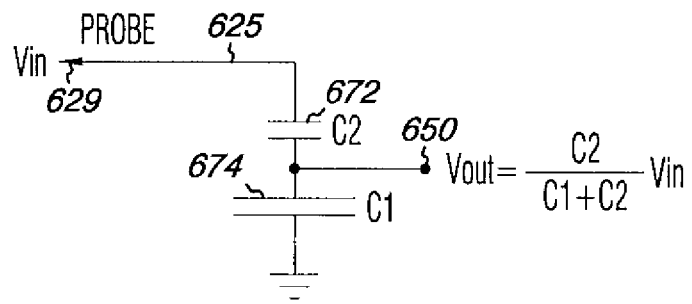
FIG. 6A illustrates a circuit diagram of a probe using a capacitive voltage divider according to an embodiment of the present disclosure.
Figure 6B:
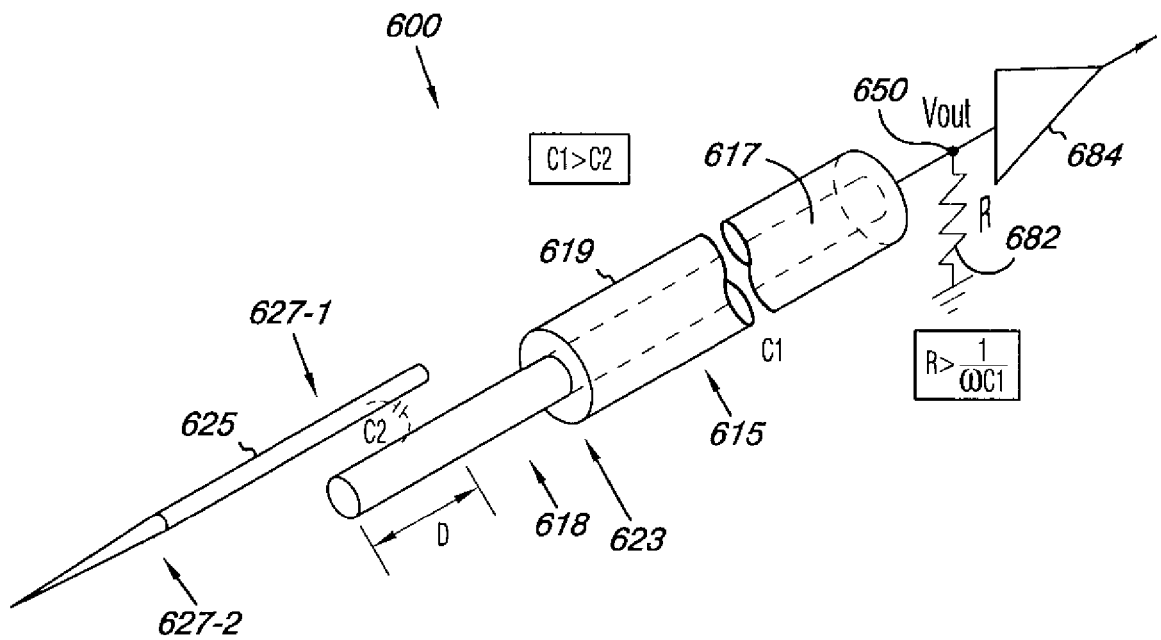
FIG. 6B illustrates an embodiment of a probe configured as a capacitive voltage divider in accordance with the embodiment illustrated in FIG. 6A.

In one or more embodiments, and as described further in connection with FIGS. 6A and 6B, the capacitor formed of the first portion 327-1 of the whisker 325 that extends distance D along the extension portion of inner conductor 317 is connected in series with a second capacitor formed of the outer conductor 319 and the inner conductor 317 of the coaxial line. In various embodiments, the capacitors form a capacitive voltage division circuit that divides the input test signal and presents an output voltage signal at an output of the capacitive voltage division circuit.

FIG. 3C illustrates an example calculation for the capacitance of a capacitor associated with one or more embodiments of the present disclosure. The example calculation shown in FIG. 3C is for calculating the capacitance (C) of a capacitor 330 formed of a first portion 327-1 of a conductive whisker, e.g., 325 shown in FIGS. 3A and 3B, that overlaps an extension portion 318 of the inner conductor of a coaxial line, e.g., inner conductor 317 of coaxial line 315 described in FIGS. 3A and 3B. As illustrated in FIG. 3C and as described above, the whisker portion 327-1 and extension portion 318 overlap a distance D.

For the example shown in FIG. 3C, the capacitance (C) between two cylindrical conductors of different sizes can be calculated as the series capacitance of a first capacitance (C1) and a second capacitance (C2), e.g., C=C1*C2/(C1+C2), where C2 is the capacitance between two cylindrical conductors of the same size. For the purposes of the calculation of C2, the smaller conductor is surrounded by an imaginary conductor having the same diameter as the larger conductor, e.g., the probe whisker having diameter d1 is surrounded by an imaginary conductor having the same diameter as the inner conductor having diameter d2. For this example calculation, C1 is calculated as the capacitance a coaxial line formed of the smaller conductor and the imaginary conductor surrounding it.

For the example calculation shown in FIG. 3C, conductor 332 represents the larger conductor, e.g., extension portion 318, conductor 336 represents the smaller conductor, e.g., whisker portion 327-1, and imaginary conductor 334 represents the imaginary conductor having the same diameter as conductor 332. Example values for various parameters, e.g., physical dimensions and constants, are illustrated in table 338.

The formula for the capacitance of a coaxial line is given as $2\pi \in r \in oD/\ln(r2/r1)$ where $\in r$ is the relative dielectric constant of the material between the cylinders, $\in o$ is the electric permittivity of free space, D is the length of the coaxial line, r2 is the radius of the outer conductor, and r1 is the radius of the inner conductor. As such, for the calculation of C1, r2 is equal to d2/2, e.g., the outer radius is equal to the radius of the imaginary conductor 334, which is d2/2, and r1 is equal to the radius of the conductor 336, which is the radius of the probe whisker, e.g., d1/2. In this example, $\in r$ is estimated at 4, and the distance D is estimated at 250 micrometers. As shown in FIG. 3C, the capacitance C1 is about 18.5 fF.

The formula for the capacitance of two cylindrical conductors of the same size is given as $\pi \in r \in oD/\ln(4h/d2)$ where $\in r$ is the relative dielectric constant of the material between the cylinders, $\in o$ is the electric permittivity of free space, D is the length of the conductors, h is the distance from the center of the cylinders to the mid-point between them, and d2 is diameter of the cylindrical conductors. In this example, $\in r$ is estimated at 4, the distance D is estimated at 250 micrometers, h is about 262.5 micrometers, and d2 is about 500 micrometers. Therefore, as shown in FIG. 3C, the capacitance C2 is about 37.5 fF.

As such, for the example shown in FIG. 3C, the capacitance, C, between the overlapping portions of the whisker 327-1 and the coaxial inner conductor 318 is about 12.4 fF. That is, the capacitor 330 formed by the overlapping portions has a relatively low capacitance of about 12.4 fF. As noted above, embodiments are not limited to the example shown in FIG. 3C. For instance, the dimensions of the conductors 327-1 and 318 can be smaller or larger than those illustrated, the conductors can be separated by a different distance and/or can overlap by a greater or lesser amount.

FIG. 4 illustrates an input waveform 465 of a circuit under test and a corresponding output waveform 467 of an electrical probe embodiment of the present disclosure. The graph 460-1 includes an input test voltage signal 465, e.g., an input test voltage signal 465 (Vnode) provided at node 335 via source 333 shown in FIG. 3A. As shown in the example illustrated in FIG. 4, the input test voltage signal 465 (Vnode) has a rise and fall time of about 10 picoseconds and a pulse width of about 50 picoseconds.

The graph 460-2 represents the output voltage signal 467 (Vout) resulting from a simulation of a probe, such as probe 300-1 shown in FIGS. 3A and 3B, receiving the input test voltage signal 465 (Vnode). As such, the output waveform 367 is approximately the derivative of the input signal 465, with the inclusion of inductive effects based on transmission line analysis.

The simulation results illustrated in FIG. 4 are based on a transmission line model such as that shown in model 300-2 shown in FIG. 3A. For instance, with reference to the embodiment shown in FIG. 3A, for the example shown in FIG. 4, the coaxial line 315 of the differentiating probe 300-1 is terminated at the measurement instrument 355 by a small resistance 359, e.g., 50 ohms in this example.

As one of ordinary skill in the art will appreciate, variability in fabricating probes, such as probe 300-1 shown in FIGS. 3A and 3B, can cause each probe to have a slightly different associated transfer function. Determination of the transfer function for a particular probe, e.g., 300-1, can allow one to solve for an input test waveform, e.g., 465 (Vnode), causing an arbitrary output waveform, e.g., 467 (Vout). That is, an input test voltage signal, e.g., 465, can be recreated based on an output voltage signal, e.g., 467, measured across an input resistor, e.g., input impedance 359 shown in FIG. 3A. As such, once the transfer function of the probe, e.g., 300-1, is known, the transfer function can be used to determine the characteristics of an unknown input test voltage signal being probed, e.g., 465, can be determined based on the measured differentiated output signal, e.g., 467.

Figure 5A:
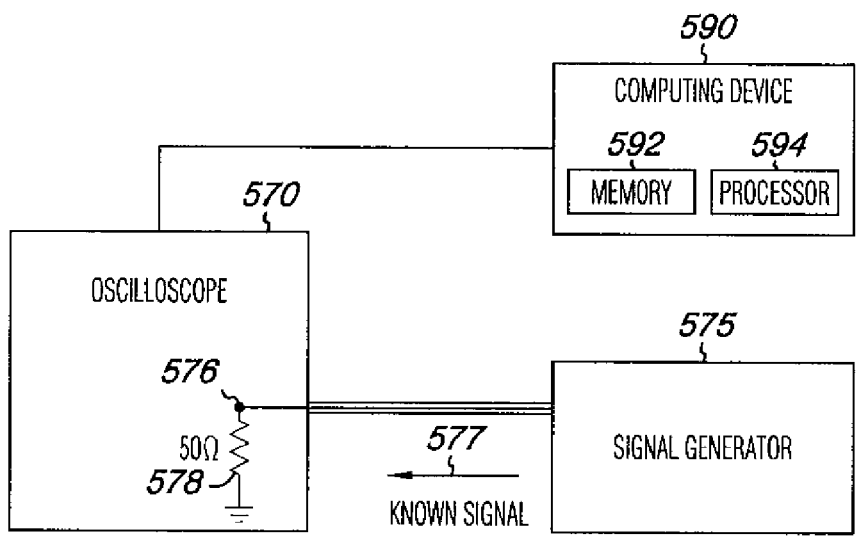
FIGS. 5A and 5B illustrate a method for characterizing a probe according to an embodiment of the present disclosure.
Figure 5B:
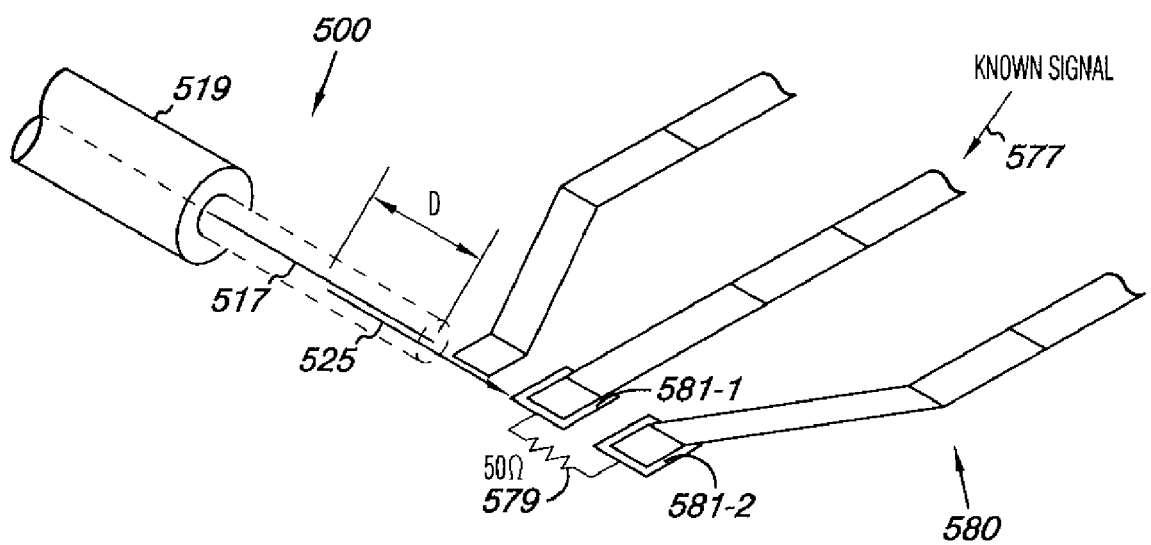

FIGS. 5A and 5B illustrate a method for characterizing, e.g., calibrating, a probe, e.g., probe 500, in order to determine the particular transfer function associated with the probe 500. The probe 500 illustrated in FIG. 5B can be a differentiating probe such as probe 300-1 described above in connection with FIGS. 3A to 3C. The probe 500 can also be a capacitive voltage division probe such as probe 600 described in connection with FIGS. 6A and 6B below.

In the embodiment illustrated in FIG. 5B, the probe 500 includes a coaxial line having an outer conductor 519 and an inner conductor 517. As described in connection with FIGS. 3A to 3C, a portion of the inner conductor 517 is separated from a conductive probe whisker 525 and extends along a portion of the whisker 525 a distance D.

FIG. 5A includes a signal generator 575 that can generate a known and well controlled input signal 577 that can be measured across a termination input resistor 578 at an input 576 of a measurement instrument 570, e.g., an oscilloscope in this example. The example shown in FIG. 5A includes a computing device 590 coupled to the oscilloscope 570. The computing device includes a memory resource 592 and a processor 594. The memory 592 can include program instructions storable thereon which can be executed by the processor 594 to perform various functions associated with calibrating a test probes.

In order to calibrate a particular test probe, e.g., probe 500, the known signal 577 is generated by the signal generator 575 and measured across the 50 ohm input resistor 578, e.g., at node 576. As shown in FIG. 5B, the known signal 577 can also be provided to a low impedance microwave probe 580 having a set of probe tips terminated on test pads 581-1 and 581-2 having a 50 ohm resistor 579 coupled therebetween. In this example, the pad 581-1 is a signal pad 581-1 and the pad 581-2 is a ground pad 581-2. Since the signal 577 is a known and controlled signal, and the resistors 578 and 579 have the same value, e.g., 50 ohms in this example, the same signal will appear across the resistors 578 and 579.

As shown in FIG. 5B, the well controlled signal that appears across resistor 579 can be sampled with the probe 500 and a corresponding output signal, e.g., output signal 467 shown in FIG. 4, can be obtained by probe 500. As the reader will appreciate, the output signal obtained by probe 500 can be measured by a measurement instrument to which the probe 500 is connected, e.g., oscilloscope 570. The ratio of the output signal obtained by the probe 500 and the input signal measured across the resistor 579 provides the transfer function associated with the particular probe 500.

The determined transfer function associated with a probe, e.g., 500, can then be used to determine the characteristics of an unknown test input signal of a circuit node under test based on the output signal of the probe. For instance, program instructions storable on a memory 592 can be executed by a processor 594 to calculate an input waveform signal based on the known output waveform signal of the probe and on the known transfer function of the probe. The characteristics of the input test signal can be more accurately represented as compared to prior art probing techniques due to the reduced loading of the circuit node under test provided by low capacitance probing embodiments of the present disclosure.

FIG. 6A illustrates a circuit diagram of a probe using a capacitive voltage divider according to an embodiment of the present disclosure, and FIG. 6B illustrates an embodiment of a probe 600 configured as a capacitive voltage divider in accordance with the embodiment illustrated in FIG. 6A.

In the embodiment illustrated in FIG. 6A, the probe includes a conductive whisker 625 that has a probe tip 629 for receiving an input test voltage signal, e.g., Vin, from a circuit node under test. In this embodiment, the probe tip 629 is coupled in series to a capacitor 672 (C2) that is connected in series with a another capacitor 674 (C1) to form a capacitive voltage division circuit. As such, an output 650 of the probe illustrated in FIG. 6A is located between the capacitors 672 and 674, e.g., at output node 650. The output voltage signal Vout appearing at output node 650 is equal to the input voltage signal Vin multiplied by the value of C2 and divided by the sum of C1 and C2, e.g., Vout=VinC2/(C1+C2).

In the embodiment illustrated in FIG. 6B, the probe 600 includes a coaxial cable 615 having an inner conductor 617 and an outer conductor 619. The inner and outer conductors of cable 615 are separated by a dielectric material and provide a first capacitive relationship, e.g., capacitor C1. As illustrated in FIG. 6B, an extension portion 618 of the inner conductor 617 extends beyond the outer conductor 619 at a probe end 623 of the cable 615.

The probe 600 includes a conductive whisker 625 having a first portion 627-1 that extends a distance D along the extension portion 618 of the inner conductor 617 such that the portions 618 and 627-1 provide a second capacitive relationship, e.g., the portions 618 and 627-1 form a second capacitor C2. The capacitance C2 is indicated by a dashed capacitor in FIG. 6B. In various embodiments, and as illustrated in FIG. 6B the second capacitor C2 is connected in series with the first capacitor C1 such the first and second capacitive relationships, e.g., capacitors C1 and C2, form a capacitive voltage divider as shown in FIG. 6A.

The conductive whisker 625 of probe 600 also includes a second portion 627-2 that terminates in a probe tip to for contact with a circuit node under test in order to receive an input test voltage signal at the circuit node under test. Although not shown in FIG. 6B, the whisker 625 can be coupled to the probe 600 via a dielectric epoxy or other material as shown in FIGS. 3A and 3B.

In various embodiments, the capacitance corresponding to the first capacitive relationship, e.g., C1, is greater than the capacitance corresponding to the second capacitive relationship, e.g., C2. That is, the capacitance of capacitor C1 can greater than the capacitance of capacitor C2. In various embodiments, the capacitance of capacitor C2 is not greater than about 15 fF.

In one or more embodiments such as probe 600, e.g., embodiments in which the probe includes a capacitive voltage divider, the coaxial cable 615 can be terminated by an amplifier 684 having an associated input resistance 682. In various embodiments, the output of the capacitive voltage division circuit, e.g., an output end of the inner conductor 317, can be coupled to the input of the amplifier 684 and to the input resistor 682.

In one or more embodiments, the input resistance 682 of the amplifier 684 is greater than a characteristic impedance associated with the coaxial cable 615. The characteristic impedance associated with the coaxial line 615 is given by $1/\omega C1$, where $\omega$ is the radian frequency. In embodiments in which the characteristic impedance of the line 615 is less than the input resistance 682, the output voltage Vout, which appears across capacitor C1 at node 650, can be accurately sensed with the amplifier 684.

Probe embodiments using a capacitive voltage divider coupled to the probe tip, such as probe 600, can provide improved measurements of high frequency test signals on high impedance test nodes over prior probes and probing techniques. For instance, various prior probes use resistive dividers to provide a high input resistance. However, at high frequencies, e.g., in the GHz range, the stray capacitance associated with resistive voltage dividers can cause undesirable loading of a circuit under test.

Another benefit of probe embodiments using a capacitive voltage divider coupled to the probe tip, such as probe 600, is the improved bandwidth range over which such probes can sense accurately as compared to prior probes. For example, in the embodiment illustrated in FIG. 6B, the output voltage (Vout), at the input node 650 to the amplifier 684, is independent of the frequency of the input test signal, e.g., Vin. That is, the output voltage signal of the capacitive voltage divider of probe 600 depends on the ratio of C1 to C1+C2 and does not depend on the frequency of Vin.

In one or more embodiments of the present disclosure, a probe can obtain a measurement from a circuit node under test without making direct contact, e.g., without physically touching, with the node. For instance, capacitive coupling can occur between the capacitors C1 and C2 of capacitive voltage divider to obtain an output signal without direct contact.

Methods, devices, and systems for probing electrical circuits without loading the circuits are described herein. One embodiment of an electrical probe includes a coaxial cable having an inner conductor and an outer conductor, an extension portion of the inner conductor extending beyond the outer conductor at a probe end of the cable. The electrical probe includes a conductive whisker having a first portion separated from and extending a distance along the extension portion such that the first portion and the extension portion form a first capacitor and a second portion having a probe tip for receiving an input test signal from a circuit node under test.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An electrical probe, comprising:
   a coaxial cable having an inner conductor and an outer conductor, an extension portion of the inner conductor extending beyond the outer conductor at a probe end of the cable; and
   a conductive whisker including:
      a first portion separated from and extending a distance along the extension portion such that the first portion and the extension portion form a first capacitor; and
      a second portion having a probe tip extending beyond an end of the inner conductor and configured to receive an input test signal from a circuit node under test; wherein the conductive whisker is positioned between the inner conductor and the outer conductor, and wherein the inner conductor is configured to not contact the circuit node under test.

2. The probe of claim 1, wherein the first portion of the conductive whisker is separated from the extension portion by a first dielectric material.

3. The probe of claim 2, wherein the first dielectric material is different than a second dielectric material between the inner conductor and the outer conductor of the coaxial cable.

4. The probe of claim 1, wherein the probe is configured such that the end of the inner conductor is not in contact with the circuit node under test while the probe tip receives the input test signal from the circuit node under test.

5. The probe of claim 1, wherein an input end of the coaxial cable is terminated at a measurement device by a resistor.

6. The probe of claim 5, wherein the first capacitor is coupled in series to the resistor, the resistor having a resistance of not more than 50 ohms.

7. The probe of claim 1, wherein the first capacitor is in series with a second capacitor formed of the outer conductor and the inner conductor of the coaxial cable, the first and second capacitors forming a capacitive voltage division circuit that divides the input test signal and presents an output voltage signal at an output of the capacitive voltage division circuit.

8. The probe of claim 7, wherein the coaxial cable is terminated by an amplifier having an associated input resistance that is greater than a characteristic impedance associated with the second capacitor.

9. The probe of claim 8, wherein the output of the capacitive voltage division circuit is coupled to an input of the amplifier such that the output voltage signal is provided to the amplifier.

10. The probe of claim 9, wherein the output voltage signal is independent of the frequency of the input test signal.

11. An electrical probe, comprising:
    a coaxial cable having an inner conductor and an outer conductor, the coaxial cable coupled to an input resistor at an input end, wherein an extension portion of the inner conductor extends beyond the outer conductor at a probe end of the cable; and
    a conductive whisker including:
       a first portion separated from and extending a distance along the extension portion such that the first portion and the extension portion produce a capacitive coupling effect in series with the input resistor; and
       a second portion having a probe tip configured to receive an input test signal from a circuit node under test, wherein at least a portion of the second portion does not overlap the extension portion of the inner conductor; wherein the conductive whisker is positioned between the inner conductor and the outer conductor and is not in contact with the outer conductor, and wherein the inner conductor is configured to not contact the circuit node under test.

12. The probe of claim 11, wherein the input end of the cable is adapted for connection to a measurement instrument that determines one or more characteristics of the received input test signal based on an output signal measured across the input resistor.

13. The probe of claim 11, wherein the resistance of the input resistor is not greater than 50 ohms and a capacitance corresponding to the capacitive coupling effect is not greater than 15 fF.

14. The probe of claim 11, wherein the first portion of the whisker and the extension portion of the inner conductor are encapsulated by a dielectric material.

15. The probe of claim 11, wherein the first portion of the whisker and the extension portion of the inner conductor form a transmission line transformer.

16. The probe of claim 11, wherein the first portion and the extension portion producing the capacitive coupling effect are in series with a capacitor formed of the outer conductor and the inner conductor of the coaxial cable thereby forming a voltage division circuit that divides the input test signal and presents an output voltage signal at an output of the voltage division circuit.

17. The probe of claim 11, wherein a diameter of the whisker is less than a diameter of the inner conductor.

18. An electrical probe, comprising:
    a coaxial cable having an inner conductor and an outer conductor separated by a first dielectric material and providing a first capacitive relationship, wherein an extension portion of the inner conductor extends beyond the outer conductor at a probe end of the cable; and
    a conductive whisker including:
       a first portion separated from and extending a distance along the extension portion such that the first portion and the extension portion provide a second capacitive relationship in series with the first capacitive relationship such that the first and second capacitive relationships form a capacitive voltage divider; and a second portion having a probe tip extending beyond an end of the inner conductor and configured to receive an input test voltage signal from a circuit node under test;

wherein the conductive whisker is positioned between the inner conductor and the outer conductor, and wherein the inner conductor is configured to not contact the circuit node under test.

19. The probe of claim 18, wherein the probe is configured such that the end of the inner conductor is not in contact with the circuit node under test while the probe tip receives the input test signal from the circuit node under test.

20. The probe of claim 18, wherein the probe is configured such that the input test signal is received only by the probe tip of the second portion.

* * * * *